US008711024B2

(12) United States Patent
Sabut et al.

(10) Patent No.: US 8,711,024 B2
(45) Date of Patent: Apr. 29, 2014

(54) SWITCHED CAPACITOR AMPLIFIER

(75) Inventors: Marc Sabut, Eybens (FR); Hugo Gicquel, Grenoble (FR); Fabien Reaute, Renage (FR); François Van Zanten, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 13/002,274

(22) PCT Filed: Jun. 22, 2009

(86) PCT No.: PCT/EP2009/057734
§ 371 (c)(1),
(2), (4) Date: May 13, 2011

(87) PCT Pub. No.: WO2010/000635
PCT Pub. Date: Jan. 7, 2010

(65) Prior Publication Data
US 2011/0205098 A1 Aug. 25, 2011

(30) Foreign Application Priority Data
Jul. 3, 2008 (EP) .................................. 08305375

(51) Int. Cl.
*H03M 1/12* (2006.01)
(52) U.S. Cl.
USPC ......................................... 341/155; 341/156

(58) Field of Classification Search
USPC ................. 341/155, 161, 162, 163, 159, 172;
327/337, 552, 554, 336; 330/258, 109, 330/292, 310
See application file for complete search history.

(56) References Cited

U.S. PATENT DOCUMENTS

| 4,138,649 | A | * | 2/1979 | Schaffer | 330/9 |
| 5,973,536 | A | * | 10/1999 | Maejima | 327/337 |
| 6,008,685 | A | * | 12/1999 | Kunst | 327/512 |
| 6,259,313 | B1 | | 7/2001 | Lewicki | |
| 7,295,070 | B2 | * | 11/2007 | Dillon | 330/258 |

OTHER PUBLICATIONS

International Search Report dated Sep. 23, 2009 from corresponding International Application PCT/EP2009/057734.
Tertulien Ndjountche et al:, *Improved Structures for Programmable Filters: Application in a Switched-Capacitor Adaptive Filter Design*, IEEE Transactions on Circuits and Systems II: Express Briefs, IEEE Service Center, New York, NY, vol. 46, No. 9, Sep. 1, 1999, XP011013120.

* cited by examiner

*Primary Examiner* — Joseph Lauture
(74) *Attorney, Agent, or Firm* — Wolf, Greenfield & Sacks, P.C.

(57) ABSTRACT

A switched capacitor amplifier having an amplification unit adapted to amplify a differential signal; a first switched capacitor block including a first plurality of capacitors operable to sample a first differential input signal during a first sampling phase and to drive the amplification unit during a first drive phase; and a second switched capacitor block including a second plurality of capacitors operable to sample a second differential input signal during a second sampling phase and to drive the amplification unit during a second drive phase.

19 Claims, 3 Drawing Sheets

SWITCHED CAPACITOR AMPLIFIER

CROSS REFERENCE TO RELATED APPLICATIONS

This application is a U.S. National Stage patent application based on PCT Application Number PCT/EP2009/057734, filed on Jun. 22, 2009, entitled "Switched Capacitor Amplifier", which application claims the priority benefit of European patent application number 08305375.1, filed on Jul. 3, 2008, entitled "Switched Capacitor Amplifier," which applications are hereby incorporated by reference to the maximum extent allowable by law.

BACKGROUND OF THE INVENTION

1. Field of the Invention

The present invention relates to a switched capacitor amplifier, and in particular to a switched capacitor amplifier having two phases of operation.

2. Discussion of the Related

ArtSwitched capacitor amplifiers generally comprise an amplifier stage coupled to a number of switched capacitors, which are switched in order to sample an input voltage at the input of a circuit during a first phase, and then to supply, during a subsequent phase, the signal to an amplifier stage to be amplified.

In differential switched capacitor amplifiers it is generally an aim to control a common mode output of the amplifier at a fixed voltage, at the same time as providing a high static gain in order to ensure a high linearity of the differential amplifier. However, in known switched capacitor amplifiers, it is hard to obtain both of these aims.

Furthermore, such switched capacitor amplifiers tend to be inefficient in terms of power consummation.

SUMMARY OF THE INVENTION

It is an aim of embodiments of the present invention to at least partially address one or more drawbacks of known switched capacitor amplifier circuits.

According to one aspect of the present invention, there is provided a switched capacitor amplifier comprising: an amplification unit adapted to amplify a differential signal; a first switched capacitor block comprising a first plurality of capacitors operable to sample a first differential input signal during a first sampling phase and to drive the amplification unit during a first drive phase; a second switched capacitor block comprising a second plurality of capacitors operable to sample a second differential input signal during a second sampling phase and to drive the amplification unit during a second drive phase.

According to an embodiment of the present invention, the first switched capacitor block alternates between the first sampling phase and the first drive phase, and the second switched capacitor block alternates between the second sampling phase and the second drive phase.

According to an embodiment of the present invention, the switched capacitor amplifier comprises control circuitry for generating first and second timing signals for controlling the first and second switched capacitor blocks for example such that the first drive phase occurs during the second sampling phase and such that the second drive phase occurs during the first sampling phase.

According to an embodiment of the present invention, the first switched capacitor block is adapted to couple the first plurality of capacitors to first differential inputs of the switched capacitor amplifier during the first sampling phase and to a pair of differential input terminals of the amplification unit during the first drive phase; and the second switched capacitor block is adapted to couple the second plurality of capacitors to second differential inputs of the switched capacitor amplifier during the second sampling phase and to the pair of differential input terminals of the amplification unit during the second drive phase.

According to another embodiment of the present invention, during the first sampling phase the first switched capacitor block is adapted to couple the first plurality of capacitors between the first differential inputs and a first reference voltage level.

According to another embodiment of the present invention, the switched capacitor amplifier further comprises a feedback control block adapted to provide a common mode feedback signal to the amplification unit based on differential output signals of the amplification unit.

According to another embodiment of the present invention, the feedback control block comprises a first resistor having a first terminal coupled to a first differential output terminal of the amplification unit and a second resistor having a second terminal coupled to a second differential output terminal of the amplification unit, and a comparator comprising a first input coupled to the second terminals of the first and second transistors and a second input coupled to receive a reference voltage.

According to another embodiment of the present invention, the switched capacitor amplifier further comprises feedback capacitors coupled between differential input and output terminals of the amplification unit during the first and second drive phases.

According to another embodiment of the present invention, the amplification unit comprises a two-stage differential amplifier.

According to another embodiment of the present invention, the amplification unit is a chopper amplifier.

According to another embodiment of the present invention, the switched capacitor amplifier is adapted to perform an integration of the first and/or second differential input signal.

According to a further aspect of the present invention, there is provided a system comprising input circuitry arranged to provide at least one differential input signal; and the above switched capacitor amplifier coupled to the input circuitry to receive the at least one differential input signal.

According to a further aspect of the present invention, there is provided an analog to digital converter comprising input circuitry arranged to provide at least one differential input signal; and the above switched capacitor amplifier coupled to the input circuitry to receive the at least one differential input signal.

According to a further aspect of the present invention, there is provided an integrated circuit comprising the above switched capacitor amplifier.

According to a further aspect of the present invention, there is provided a method of amplification comprising: controlling a first switched capacitor block to sample a first differential input signal during a first sampling phase and to drive an amplification unit during a first drive phase; and controlling a second switched capacitor block to sample a second differential input signal during a second sampling phase and to drive the amplification unit during a second drive phase, wherein the first and second drive phases do not overlap.

According to an embodiment of the present invention, the first and second differential input signals are identical to each other, while according to another embodiment of the present invention, the first and second differential input signals are independent of each other.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

DETAILED DESCRIPTION

Figure 1:
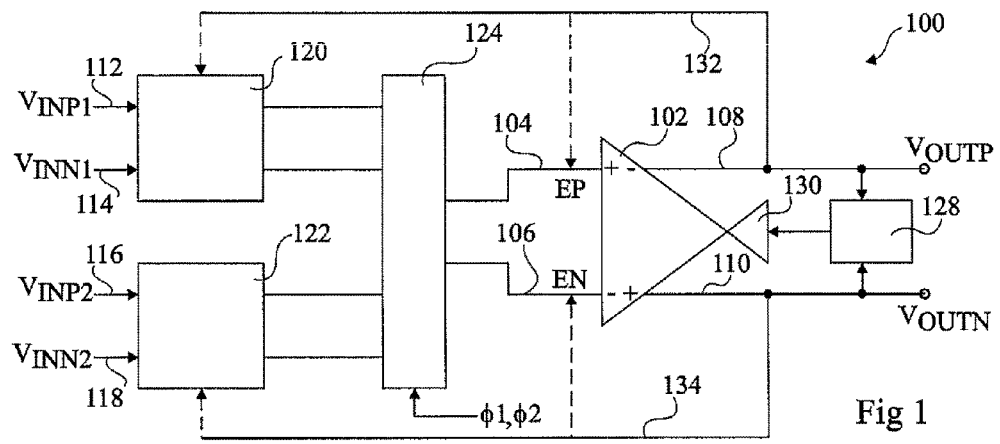
FIG. 1 illustrates a switched capacitor amplifier according to an embodiment of the present invention.

FIG. 1 illustrates a switched capacitor amplifier 100. As illustrated, amplifier 100 comprises an amplification unit 102, having differential positive and negative inputs 104 and 106 respectively, and differential negative and positive outputs 108 and 110 respectively. In particular, the amplification unit is arranged to be driven by one differential input signal at a time, and thus comprises a single pair of differential inputs and outputs. The amplifier circuit comprises a pair of differential input terminals 112 and 114, and a pair of differential input terminals 116 and 118. Input terminals 112 to 118 receive input voltage signals $V_{INP1}$, $V_{INN1}$, $V_{INP2}$ and $V_{INN2}$ respectively.

Input terminals 112 and 114 are coupled to the inputs of a switched capacitor block 120, which comprises a number of switched capacitors (not shown in FIG. 1). Input terminals 116 and 118 are coupled to the input nodes of a switched capacitor block 122, which also comprises a number of switched capacitors (not shown in FIG. 1). The switched capacitor blocks 120 and 122 each comprise differential outputs coupled to a switch block 124. Switch blocks 120, 122 and 124 are controlled by timing signals Ø1 and Ø2. These timing signals select when the differential outputs of the switch capacitor block 120 or the differential outputs from the switched capacitor block 122 are coupled the differential input terminals 104 and 106 of the differential amplification unit. The timing signals Ø1 and Ø2 are, for example, generated by control circuitry (not shown in FIG. 1).

The output terminals 108 and 110 of the amplification unit 102 provide differential output signals $V_{OUTP}$ and $V_{OUTN}$ of the circuit. VOUTP has opposite phase to input signal EN of the amplification unit, while VOUTP has opposite phase to input signal EP of the amplification unit. These signals are also provided to a feedback control block 128, which is coupled to outputs 108 and 110 and generates a control signal based on these signals to a comparator 130 of the amplification unit 102. This control signal provides common mode feedback, allowing the common mode of the output signals to be controlled.

As illustrated by lines 132 and 134, the output terminals 108 and 110 of the amplification unit 102 are provided as feedback signals to the amplification unit inputs 104, 106 or to the switched capacitor blocks 120 and 122, depending on the type of amplification that is to be performed by the switched capacitor amplifier.

In operation, each of the switched capacitor blocks 120 and 122 operates having a sampling phase, during which the input signals on the inputs 112 and 114 or 116 and 118 are coupled to capacitors to sample the input voltages. Furthermore, each of the switched capacitor blocks 120, 122 operates having a drive phase, during which capacitors in the block are coupled to the inputs of the amplification unit 102, to drive the amplification unit. The sampling and drive phases in each of the blocks 120, 122 alternates, and the sampling and drive phases of the two blocks 120, 122 are offset with respect to each other, so that only one of the blocks is driving the amplification unit at any one time. The timing can be arranged for example such that while one block is sampling the input, the other block is driving the amplification unit, and vice versa.

The differential input signals $V_{INP1}$ and $V_{INP2}$, and $V_{INN1}$ and $V_{INN2}$ may be different from each other, allowing two differential signals to be amplified by the same differential amplifier, or $V_{INP1}$ could be the same signal as the $V_{INP2}$, while the input signal $V_{INN1}$ is the same signal as $V_{INN2}$, allowing the sampling rate of the input differential signal to be doubled.

Figure 2:
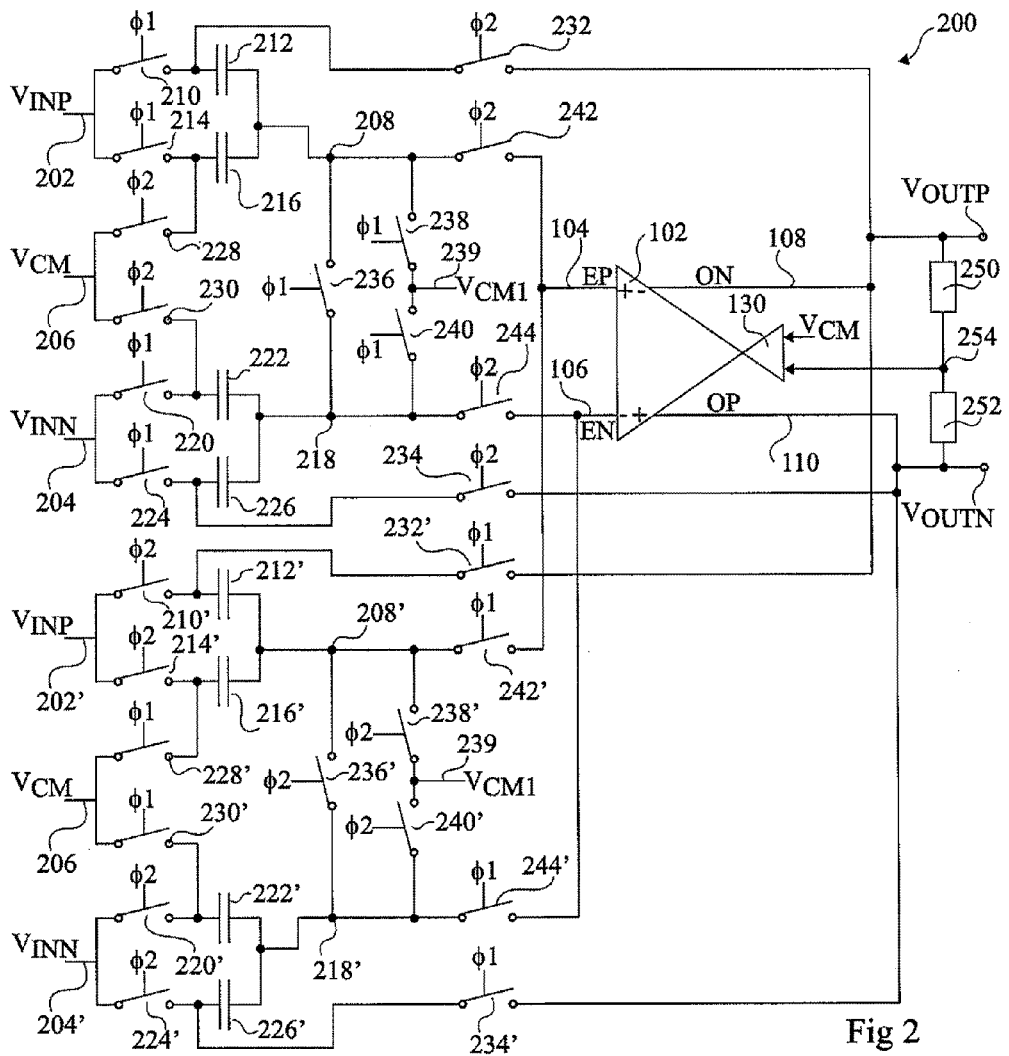
FIG. 2 illustrates a switched capacitor amplifier according to a further embodiment of the present invention.

FIG. 2 illustrates the switched capacitor amplifier 100 of FIG. 1 in more detail according to one embodiment.

In this embodiment, the differential input signals to the switched capacitor blocks are the same as each other. The circuit comprises the same amplification unit 102 as shown in FIG. 1, having the same input terminals 104, 106 and output terminals 108, 110 and these will not be described again in detail. The circuitry forming the switched capacitor blocks 120, 122 and switch 124 will now be described.

Input terminal 202 is coupled to a node 208 by a switch 210 and a capacitor 212 coupled in series, and also, in parallel, by a switch 214 and a capacitor 216 coupled in series. In similar fashion, input terminal 204 is coupled to a node 218 by a switch 220 and a capacitor 222 coupled in series, and, in parallel, by a switch 224 and a capacitor 226 also coupled in series.

A node between switch 214 and capacitor 216 is coupled to a reference voltage VCM by a switch 228, while a node between the switch 220 and capacitor 222 is coupled to reference voltage VCM via a switch 230. The VCM reference voltage is a common mode voltage, for example, at a level halfway between the supply voltage level and a ground voltage level, although it could be at a different value as would be described in more detail below.

The node between switch 210 and capacitor 212 is coupled to the output terminal 108 of the amplification unit 102 by a switch 232, while the node between switch 224 and capacitor 226 is coupled to the output terminal 110 of the amplification unit 102 by a switch 234.

Nodes 208 and 218 are coupled together by a switch 236, and also, in parallel, by switches 238 and 240 coupled in series. A node 239 between switches 238 and 240 is coupled to a reference voltage VCM1.

Node 208 is also coupled to the input terminal 104 of the amplification unit 102 by a switch 242, while node 218 is coupled to the input terminal 106 of the amplification unit 102 by a switch 244.

Switches, capacitors and nodes 208 to 240 in FIG. 2 perform the functions of the switched capacitor block 120 of FIG. 1, while switches 242 and 244 form part of the switch block 124.

The lower half of FIG. 2 illustrates switches, capacitors and nodes 208' to 240' which for the switched capacitor block 122 of FIG. 1, and is identical in lay out to features 208 to 210, with the same reference numerals being used for like features with the addition of an apostrophe.

The output terminals 108 and 110 of the amplification unit 102 are also coupled together by resistors 250 and 252 connected in series. Resistors 250 and 252 preferably have the same resistance value, and the node between these two resistors, labelled 254 in FIG. 2, is coupled to the comparator 130 of the amplification unit 102. Comparator 130 also receives the reference voltage VCM, and based on a comparison between VCM and the voltage at node 254, provides a common mode feedback signal for controlling the common mode provided by the amplification unit 102, as will be described in more detail below.

In operation, Ø1 and Ø2 have opposite phases to each other except during transitions. Switches controlled by Ø1 are ON when Ø1 is high, and OFF when Ø1 is low, and likewise switches controlled by Ø2 are ON when Ø2 is high, and OFF when Ø2 is low. When Ø1 is high, switched capacitor block 120 is controlled to same the differential input signal at inputs 202 and 204 by coupling one terminal of capacitors 212 and 216 to input 202, and one terminal of capacitors 222 and 226 to input 204. At the same time, the other terminals of capacitors 212, 216, 222 and 226 are coupled together, and the reference voltage VCM1, and these capacitors are isolated from the inputs to the amplification unit 102. Thus the differences between $V_{INP}$ and $V_{INN}$ with respect to the reference voltage VCM1 are stored on capacitor pairs 212, 216 and 222, 226 respectively.

At the same time, while Ø1 is high, capacitors 212', 216', 222' and 226' are isolated from the inputs 202, 204. Furthermore, capacitors 212' is coupled between output 108 and input 104 of amplification unit 104, while capacitor 216' is coupled between VCM input 206 and input 104'. In a similar fashion, capacitors 226' is coupled between output 110 and input 106 of amplification unit 104, while capacitor 222' is coupled between VCM input 206 and input 106. Thus the amplification unit 102 is driven based on the voltages stored on capacitors 216' and 222' at the inputs of the amplification unit and on feedback capacitors 212' and 226'.

The gain of the amplification unit 102 can thus be expressed as:

$$(V_{OUTN}-V_{OUTP})/V_{IN}=(C_f+C_s)/C_f$$

wherein $V_{OUTN}$ and $V_{OUTP}$ are the output voltages of the amplification unit when driven by $V_{IN}$, which is the voltage difference between $V_{INP}$ and $V_{INN}$. $C_f$ is the value of the feedback capacitors 212, 226, 212' and 226', which, for example, all have equal capacitance. $C_s$ is the value of the sampling capacitors 216, 222, 216' and 222', which also for example have equal capacitances.

The input common mode of the amplification unit 102 can be expressed as: $(V_{EP}+V_{EN})/2 \approx V_{EP} \approx V_{EN} = V_{CM1}$. This is equivalent to the input common mode of the amplifier 102 being fixed at the reference voltage $V_{CM1}$.

Figure 3:
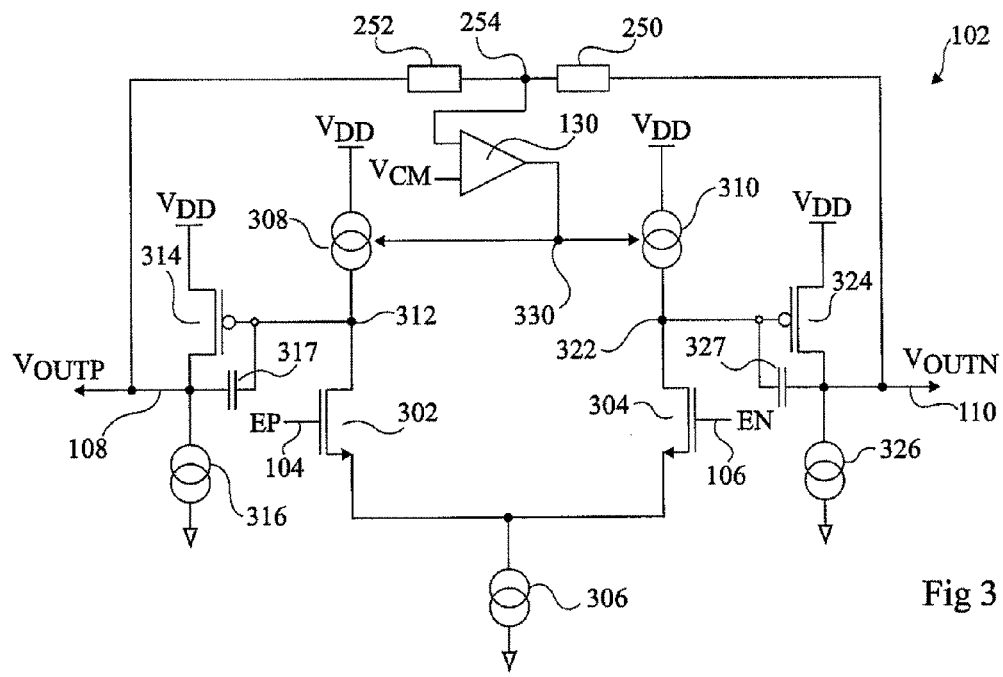
FIG. 3 illustrates an amplifier unit of the switched capacitor amplifier of FIG. 1 in more detail according to a further embodiment of the present invention.

FIG. 3 illustrates the amplification unit 102 of FIG. 1 in more detail according to one embodiment, in which it comprises a two-stage amplifier.

A first stage of the amplifier comprises a differential pair comprising a transistor 302, which has a gate node coupled to input line 104, and a transistor 304, has a gate node coupled to input line 106. Transistors 302 and 304 each have source terminals coupled to a current source 306. The drain terminal of transistor 302 is coupled to a current source 308, while the drain terminal of transistor 304 is coupled to a current source 310.

A node 312 between transistor 302 and current source 308 is further coupled to the gate of a transistor 314, which has its source/drain nodes coupled between a supply voltage level $V_{DD}$, and a current source 316. The node between transistor 314 and current source 316 is also coupled to node 312 via a capacitor 317, and provides the output voltage $V_{OUTP}$ of the amplification unit 102 on line 108. In a similar fashion, a node 322 between transistor 304 and current source 310 is coupled to the gate node of a transistor 324, which has its source/drain nodes coupled between a supply voltage level $V_{DD}$ and a current source 326. The node between transistor 324 and current source 326 is also coupled to node 322 via a capacitor 327, and provides the output voltage $V_{OUTN}$ of the differential amplification unit 102 on line 110. Transistors 314 and 324 provide the second stage of the amplification unit. Capacitors 317 and 327 provide stability to the amplifier.

Current sources 306, 316 and 326 are coupled to a ground voltage reference, for example at 0 V or a different voltage, while current sources 308 and 310 are coupled to a supply voltage, for example 2.8 V, although in alternative embodiments the ground and reference voltages could be swapped.

Common mode feedback resistors 250, 252 and comparator 130 are also shown in FIG. 3, coupled as shown in FIG. 2 between the output terminals 110 and 108. As illustrated, the output of comparator 130 is coupled to a node 330, which controls current sources 308 and 310, thereby controlling the current flow through the differential pairs 204 and 304 and allowing the common mode voltage to be controlled at the reference voltage VCM.

Figure 4:
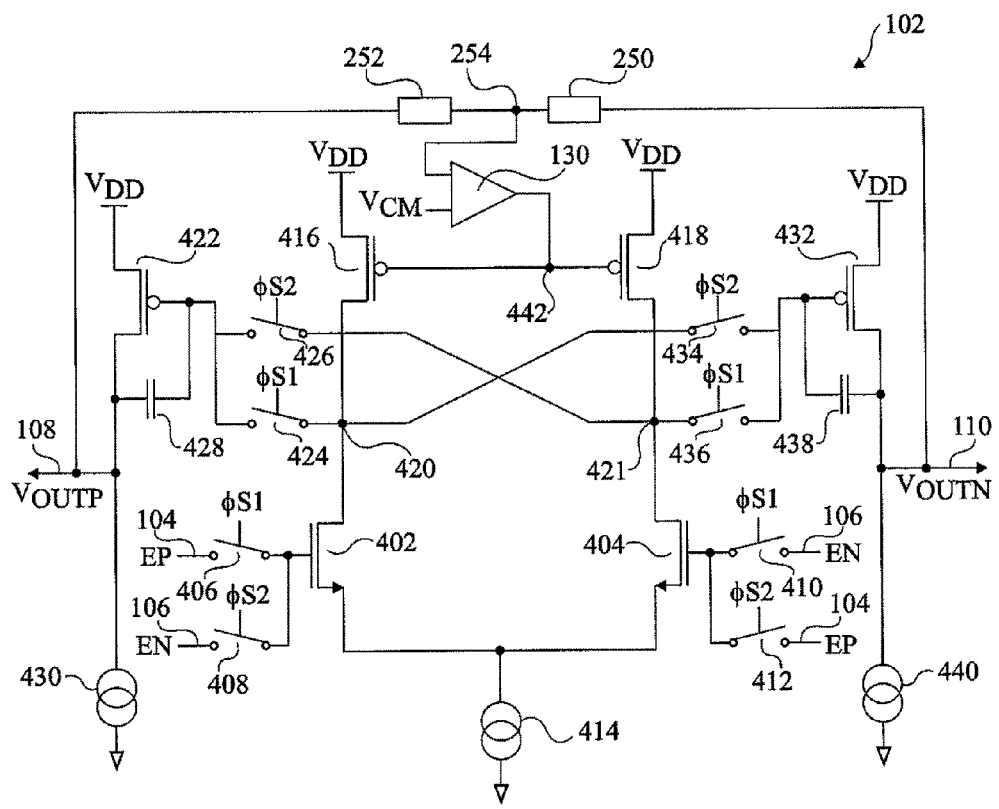
FIG. 4 illustrates an amplifying unit of the switched capacitor amplifier of FIG. 1 in more detail according to an embodiment of the present invention.

FIG. 4 illustrates an alternative embodiment of the amplification unit 102, in which the amplifier is a chopping amplifier, having two switching phases S1 and S2, and thereby allowing cancellation of both the offset voltage and the low frequency noise of the amplifier.

Again, the amplification unit 102 comprises a two-stage amplifier. The first stage comprises a differential pair 402, 404. The gate node of transistors 402 is coupled to both the input line 104 and the input line 106, via switches 406 and 408 respectively. Switch 406 is controlled by signal ØS1, while switch 408 is controlled by a signal ØS2, that is of opposite phase to ØS1. In a similar fashion, the gate terminal of transistor 404 is coupled to input line 106 via a switch 410, and to input line 104 via a switch 412. Switch 410 is controlled by the signal ØS1, while switch 412 is controlled by signal ØS2.

The source nodes of transistors 402 and 404 are coupled to a current source 414. The drain nodes of transistor 402 and 404 are coupled to a supply voltage $V_{DD}$ via transistors 416 and 418 respectively. The node between transistors 402 and 416 is labelled 420, while the node between transistors 404 and 418 is labelled 421. The gate terminal of a PMOS transistor 422 is coupled to nodes 402 and 404 via respective switches 424 and 426 controlled by signals ØS1 and ØS2 respectively. The source/drain terminals of transistor 422 are coupled between a supply voltage $V_{DD}$ and the output line 108 of the amplification unit, providing output voltage $V_{OUTP}$. The gate node of transistor 422 is also coupled output line 108 via a capacitor 428 to provide stability to the amplifier. Output line 108 is also coupled to a current source 430. In a similar fashion, the gate terminal of a transistor 432, is coupled to nodes 420 and 421 via respective switches 434 and 436 controlled by signals ØS2 and ØS1 respectively. The source/drain terminals of transistor 432 are coupled between a supply voltage $V_{DD}$ and the output line 110 of the amplification unit, providing output voltage $V_{OUTN}$. The gate node of transistor 432 is also coupled output line 110 via a capacitor 438 to provide stability to the amplifier. Output line 110 is also coupled to a current source 440.

As with the embodiments of FIGS. 2 and 3, common mode feedback control is provided by a pair of resistors 250, 252 coupled to output lines 108 and 110 and the comparator 130. In the embodiment of FIG. 4, the output of comparator 130 is coupled to a node 442, which is coupled to the gate terminals of transistors 416 and 418.

While in FIG. 4 current sources 414, 430 and 440 are coupled to a to ground reference voltage, while transistors 416, 418, 422 and 432 are coupled to a supply voltage $V_{DD}$. In alternative embodiments, the ground and supply voltage levels could be swapped.

In operation, the control signals ØS1 and ØS2 are provided such that the circuit selects alternate inputs of the differential pair 402 and 404, while at the same time selecting alternate inputs of the output transistors 422 and 432. In this way, the offset voltage and low frequency noise of the amplifier can be improved.

As an example, in the case in which a single differential signal is processed by the amplifier, the timing signals can be chosen such that ØS1=Ø1 and ØS2=Ø2, or in the case that two different signals are processed, ØS1 and ØS2 could be at half the frequency of one of Ø1, Ø2. Obviously, precautionary measures can be taken for transitions.

Figure 5:
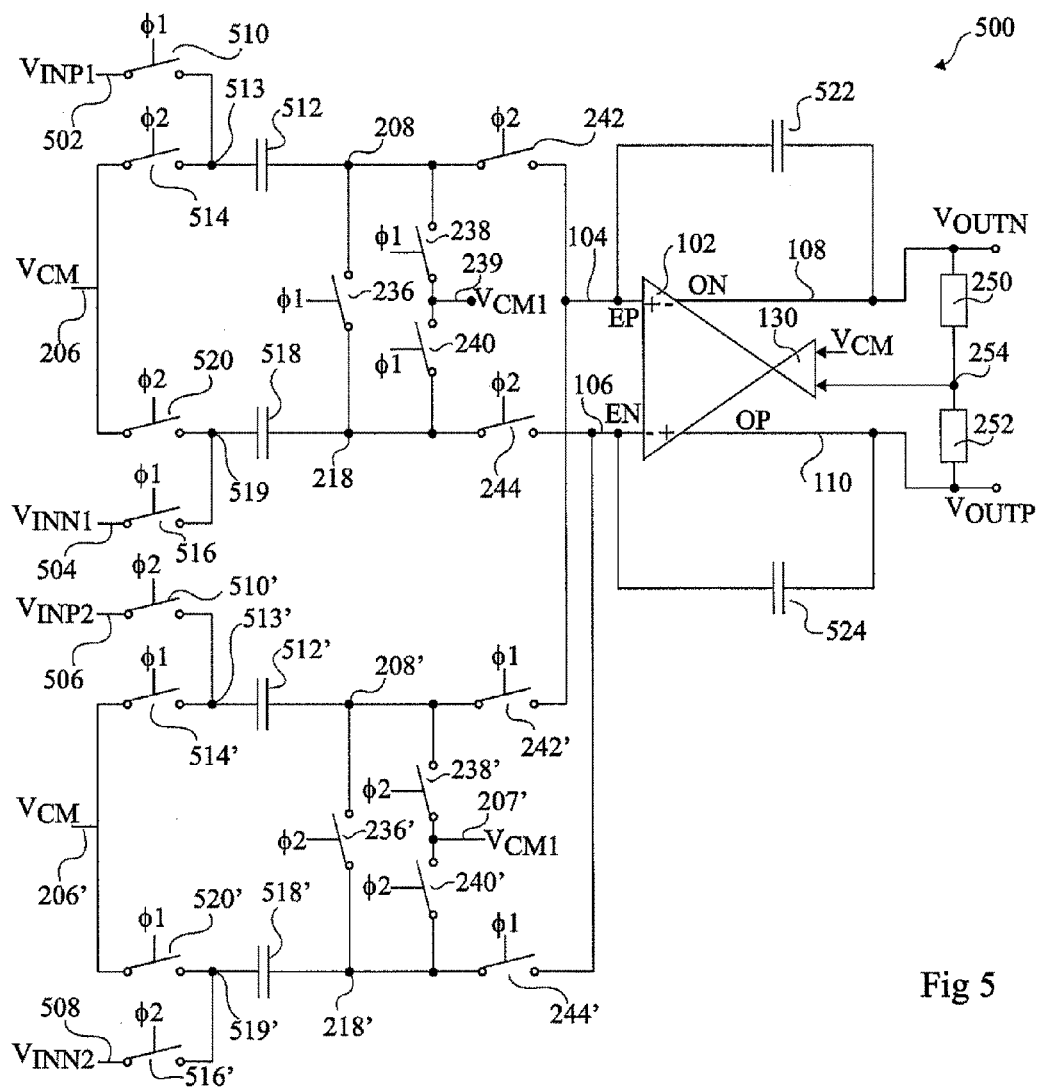
FIG. 5 illustrates a switched capacitor amplifier according to yet a further embodiment of the present invention.

FIG. 5 illustrates an alternative embodiment of a switched capacitor amplifier 500, which rather than being a gain amplifier, is an integrator amplifier, used for example to implement a sigma-delta analog to digital converter. As with the gain amplifier, this amplifier may also operate with a single input signal or a pair of different input signals.

Features in FIG. 5 which are the same as those in FIG. 2 have been labelled with like reference numerals, and will not be described again in detail.

As illustrated, the switch capacitor amplifier 500 comprises input lines 502 and 504 for receiving a first differential input signal comprising signals $V_{INP1}$ and $V_{INN1}$ and second differential input lines 506 and 508 for receiving a differential input signal comprising signals $V_{INP2}$ and $V_{INN2}$. The first and second differential input signals may be the same signals or different signals.

Input lines 208, 208' are also provided for receiving a common mode voltage VCM.

Input line 502 is coupled to node 208 via a switch 510 and a capacitor 512 coupled in series. A node 513 between switch 510 and capacitor 512 is furthermore coupled to the input line 206 via a switch 514. In a similar fashion, input line 504 is coupled to node 218 via a switch 516 and a capacitor 518 coupled in series. A node 519 coupled between switch 516 and capacitor 518 is furthermore coupled to input line 206 via a switch 520.

The circuitry coupling input lines 506 and 508 to nodes 208' and 218' is the same as described above between input lines 502, 504 and nodes 208, 218, and has been labelled with the same reference numerals with the addition of an apostrophe.

In this embodiment, feedback capacitors 522 and 524 are provided coupled directly between the output lines 108 and 110 and input lines 108 and 106 respectively.

Operation of the circuit of FIG. 5 is similar to that of FIG. 2, except that the output is integration amplification rather than gain amplification is performed.

In the circuits of FIGS. 2 and 5, two common mode voltages VCM and VCM1 are provided, generated by two voltage generators not illustrated.

The voltage reference VCM is provided to the comparator as well as to node 206. It is on this voltage reference that the output common mode of the amplifier is based: ($V_{OUTP}$+$V_{OUTN}$)/2=VCM. The voltage VCM is generally chosen to be half the supply voltage in order to allow the output signal to have the maximum amplitude variation.

The voltage reference VCM1 is applied to node 239, and the input common mode voltage of the amplifier 102 is based on this reference voltage: (VEP+VEN)/2=VCM1. The voltage VCM1 is chosen such that the amplification unit 102 is adequately driven. The voltage level required for this will depend on the particular design of the amplification unit.

Figure 6:
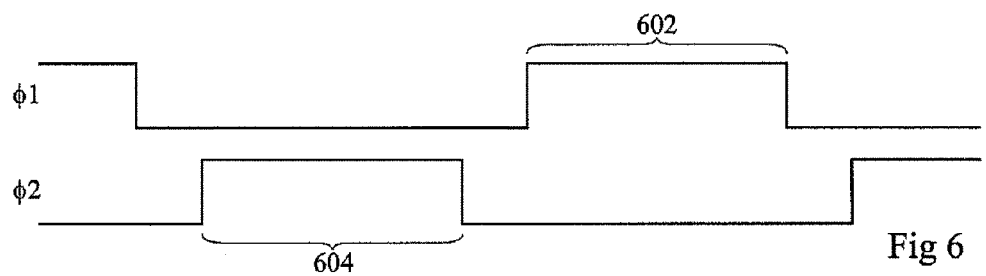
FIG. 6 illustrates timing of first and second phases of the switched capacitor amplifier according to embodiments of the present invention.

FIG. 6 illustrates an example of the timing signal Ø1 and Ø2 according to one embodiment. As illustrated, each period of the timing signals Ø1, Ø2 comprises a high pulse 602, 604 respectively. The high pulse 602, for example, corresponds to the drive phase during which switched capacitor block 122 drives the amplification unit 102, while the high pulse 604 corresponds to the drive phase during which switched capacitor block 120 drives the amplification unit 102. As illustrated, the timing signals Ø1, Ø2 are not high at the same time, and thus the drive phase of the switched capacitor block 120 does not overlap the drive phase of the switched capacitor block 122. Furthermore, as controlled by timing signal Ø1, the switched capacitor block 122 alternates between the sampling and drive phases, and as controlled by the timing signal Ø2, the switched capacitor block 120 alternates between the sampling and drive phases.

The timing shown in FIG. 6 is just an example, and in alternative embodiments other forms of signals would be possible in which the rising and falling edges of signals Ø1 and Ø2 are offset with respect to each other.

Figure 7:
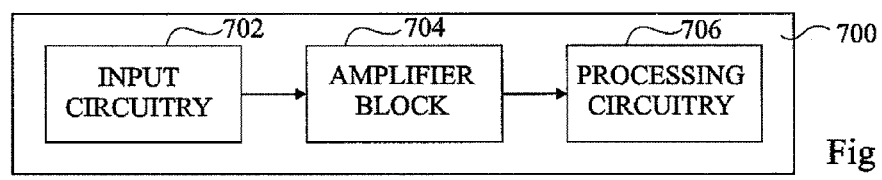
FIG. 7 illustrates an electronic device comprising a switched capacitor amplifier according to embodiments of the present invention.

FIG. 7 illustrates an electronic circuit 700 comprising input circuitry 702, an amplifier block 704 and processing circuitry 706. Device 700 is, for example, any electronic device receiving or generating differential signals that need to be amplified, such as a mobile telephone, a hard disk drive for a PC or laptop, a laptop computer, set-top box, a games console, digital camera, digital radio etc. The input circuitry for example comprises any circuitry for receiving of reading a differential signal. The differential input signal is then provided to the amplifier block 704, which comprises the switched capacitor amplifier of FIG. 1, 2 or 5, and may have unity gain or positive or negative gain, and according to some embodiments may integrate the input signal. Such an amplifier could comprise the amplification unit of FIG. 3 or 4. The differential output of the amplifier block 704 is provided to processing circuitry 706, which, for example, filters the signal, and/or provides other processing of the signal, before it is output, for example to speakers, a display or any other output means.

Thus a switched capacitor amplifier has been described. One advantage of the embodiments described herein is that common mode control is possible without short circuiting the input terminals of the amplification unit, and this means that a two-stage amplification unit may be provided, allowing greater gain and thus improved linearity when compared to a single stage amplifier. In particular, if the inputs of a first stage are short circuited, its outputs will be have a small differential caused by the first stage offset, and the second stage of the amplifier will be over-driven. In consequence, in such an amplifier, the outputs of the second stage will take a long time to return to the correct value and during this time power consumption will be large. On the other hand, in the embodiments described herein, as the input terminals of the amplification unit are not short circuited and are always driven, the amplifier is always working and is always able to process the input signal, thereby improving power consumption.

A further advantage of the embodiments described herein is that, when the same differential input signal is applied to both switched capacitor blocks, the signal can be sampled twice as often as when only one switched capacitor block is provided, thereby reducing noise in the output signal, and allowing full Nyquist operation. In particular, in some of the embodiments described herein, the amplification unit 102 processes the input signal during the two phases of the clock, preferably without dead time, resulting in twice the sampling rate for the same power consumption and substantially the same silicon area.

A further advantage of the embodiments described herein is that, when the differential input signals are different, independent signals, the same amplification unit can be used to amplify two signals. In this case, a switch can be provided at the output of the amplification unit, controlled by the timing signals Ø1, Ø2, to separate the two signals after amplification. In particular, in some of the embodiments described herein, the amplification unit 102 processes a first signal during the clock phase when Ø1 is high, and processes a second signal during the clock phase when Ø2 is high. This is preferably no dead time, as the signals are processed alternately, and current consumption and silicon area are substantially unchanged.

Having thus described illustrative embodiments of the invention, various alterations, modifications and improvements will readily occur to those skilled in the art.

The switches in FIGS. 2, 4 and 5 can be realized with transistors, as will be apparent to those skilled in the art, for example N or P channel MOS transistors.

While the amplification unit has been described comprising two stages, in alternative embodiments it could comprise only one stage, or more than two stages.

While in the example circuits of FIGS. 3 and 4 the differential pairs are illustrated as NMOS transistors, other types of transistors may be used. Furthermore, while the second stage comprises PMOS transistors, again other types of transistors could be used.

Such alterations, modifications and improvements are intended to be within the scope of the invention. Accordingly, the foregoing description is by way of example only and is not intended to be limiting. The invention is limited only as defined in the following claims and the equivalent thereto.

What is claimed is:

1. A switched capacitor amplifier comprising:
an amplification unit adapted to amplify a differential signal and to output a differential output signal;
a first switched capacitor block comprising a first plurality of capacitors operable to sample a first differential input signal during a first sampling phase and to drive said amplification unit during a first drive phase;
a second switched capacitor block comprising a second plurality of capacitors operable to sample a second differential input signal during a second sampling phase and to drive said amplification unit during a second drive phase, wherein the first and second drive phases do not overlap; and
a feedback control block adapted to provide a common mode feedback signal as input to the amplification unit based on the differential output signal of the amplification unit.

2. The switched capacitor amplifier of claim 1, wherein the first switched capacitor block alternates between the first sampling phase and the first drive phase, and the second switched capacitor block alternates between the second sampling phase and the second drive phase.

3. The switched capacitor amplifier of claim 1, further comprising control circuitry arranged to generate a first timing signal for controlling the first switched capacitor block and a second timing signal for controlling the second switched capacitor block.

4. The switched capacitor amplifier of claim 1, wherein:
the first switched capacitor block is adapted to couple said first plurality of capacitors to first differential inputs of said switched capacitor amplifier during said first sampling phase and to a pair of differential input terminals of the amplification unit during the first drive phase; and
the second switched capacitor block is adapted to couple said second plurality of capacitors to second differential inputs of said switched capacitor amplifier during said second sampling phase and to said pair of differential input terminals of the amplification unit during the second drive phase.

5. The switched capacitor amplifier of claim 4, wherein during said first sampling phase said first switched capacitor block is adapted to couple said first plurality of capacitors between the first differential inputs and a first reference voltage level.

6. The switched capacitor amplifier of claim 1, further comprising feedback capacitors coupled between differential input and output terminals of the amplification unit during said first and second drive phases.

7. The switched capacitor amplifier of claim 1, wherein the amplification unit comprises a two-stage differential amplifier.

8. The switched capacitor amplifier of claim 1, wherein the amplification unit is a chopper amplifier.

9. The switched capacitor amplifier of claim 1, adapted to perform an integration of the first and/or second differential input signal.

10. A system comprising:
input circuitry arranged to provide at least one differential input signal;
the switched capacitor amplifier of claim 1, coupled to the input circuitry to receive the at least one differential input signal.

11. An analog to digital converter comprising:
input circuitry arranged to provide at least one differential input signal;
the switched capacitor amplifier of claim 1, coupled to the input circuitry to receive the at least one differential input signal.

12. An integrated circuit comprising the switched capacitor amplifier of claim 1.

13. The switched capacitor amplifier of claim 1, wherein the switched capacitor amplifier has a linear gain.

14. The switched capacitor amplifier of claim 1, wherein:
the first switched capacitor block comprises at least one feedback capacitor and at least one sampling capacitor;
during the first drive phase the at least one feedback capacitor is connected between an input of the amplification unit and an output of the amplification unit; and
during the first drive phase the at least one sampling capacitor is connected between a first reference voltage and the input of the amplification unit.

15. The switched capacitor amplifier of claim 14, wherein:
during the first sampling phase the at least one feedback capacitor and the at least one sampling capacitor are connected between an input of the switched capacitor amplifier and a second reference voltage.

16. The switched capacitor amplifier of claim 1, wherein:
the feedback control block comprises a comparator to compare a feedback value to a reference value to produce the common mode feedback signal; and
the amplification unit comprises:
  a first current source controlled at least in part on the common mode feedback signal,
  a first transistor having a first gate coupled to a first input of the amplification unit and having a first source connected to an output of the first current source, and
  a second transistor having a second gate coupled to a node between the output of the first current source and the first source of the first transistor and having a first drain connected to a first output of the amplification unit.

17. The switched capacitor amplifier of claim 1, wherein:
the feedback control block comprises a comparator to compare a feedback value to a reference value to produce the common mode feedback signal; and
the amplification unit is arranged to adjust the differential output signal based at least in part on the output out the comparator.

18. A switched capacitor amplifier comprising:
an amplification unit adapted to amplify a differential signal;
a first switched capacitor block comprising a first plurality of capacitors operable to sample a first differential input signal during a first sampling phase and to drive said amplification unit during a first drive phase;
a second switched capacitor block comprising a second plurality of capacitors operable to sample a second differential input signal during a second sampling phase and to drive said amplification unit during a second drive phase, wherein the first and second drive phases do not overlap; and
a feedback control block adapted to provide a common mode feedback signal to the amplification unit based on differential output signals of the amplification unit, wherein the feedback control block comprises a first resistor having a first terminal coupled to a first differential output terminal of the amplification unit and a second resistor having a second terminal coupled to a second differential output terminal of the amplification unit, and a comparator comprising a first input coupled to the second terminals of the first and second resistors and a second input coupled to receive a reference voltage.

19. A method of amplification comprising:
controlling a first switched capacitor block to sample a first differential input signal during a first sampling phase and to drive an amplification unit during a first drive phase;
controlling a second switched capacitor block to sample a second differential input signal during a second sampling phase and to drive the amplification unit during a second drive phase, wherein said first and second drive phases do not overlap; and
providing a common mode feedback signal as input to the amplification unit based on a differential output signal output by the amplification unit.

* * * * *